United States Patent
Fujimori et al.

(10) Patent No.: US 9,171,850 B2
(45) Date of Patent: Oct. 27, 2015

(54) FERROELECTRIC CAPACITOR

(71) Applicant: Rohm Co., Ltd., Kyoto (JP)

(72) Inventors: Yoshikazu Fujimori, Kyoto (JP); Hiroaki Ito, Kyoto (JP); Tomohiro Date, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/300,461

(22) Filed: Jun. 10, 2014

(65) Prior Publication Data

US 2014/0284766 A1    Sep. 25, 2014

Related U.S. Application Data

(63) Continuation of application No. 13/491,834, filed on Jun. 8, 2012, now Pat. No. 8,779,486.

(30) Foreign Application Priority Data

Jun. 8, 2011  (JP) .................................. 2011-128605

(51) Int. Cl.
*H01L 27/115*   (2006.01)
*H01L 49/02*    (2006.01)

(52) U.S. Cl.
CPC .... *H01L 27/11502* (2013.01); *H01L 27/11507* (2013.01); *H01L 28/55* (2013.01); *H01L 28/65* (2013.01); *H01L 28/75* (2013.01); *H01L 2924/0002* (2013.01)

(58) Field of Classification Search
CPC .................. H01L 27/11502; H01L 27/11507; H01L 28/55; H01L 28/65; H01L 28/75; H01L 29/43
USPC .................................. 257/295, 532, E29.139
See application file for complete search history.

(56) References Cited

U.S. PATENT DOCUMENTS

| | | | |
|---|---|---|---|
| 6,169,305 B1 | 1/2001 | Takai et al. | |
| 6,596,547 B2 | 7/2003 | Aggarwal et al. | |
| 6,979,881 B2 | 12/2005 | Joo et al. | |
| 7,633,107 B2 * | 12/2009 | Matsuura | 257/295 |
| 2002/0014644 A1 * | 2/2002 | Van Buskirk et al. | 257/295 |
| 2003/0119273 A1 | 6/2003 | Aggarwal et al. | |
| 2003/0141527 A1 | 7/2003 | Joo et al. | |
| 2007/0170484 A1 | 7/2007 | Horii | |
| 2008/0003738 A1 * | 1/2008 | Matsuura | 438/220 |
| 2009/0309188 A1 * | 12/2009 | Wang | 257/532 |

FOREIGN PATENT DOCUMENTS

JP  2002-270792  9/2002
JP  2009-272319  11/2009

* cited by examiner

*Primary Examiner* — Allan R Wilson
(74) *Attorney, Agent, or Firm* — Fish & Richardson P.C.

(57) ABSTRACT

A ferroelectric capacitor includes a ferroelectric film, a lower electrode in contact with one surface of the ferroelectric film, and an upper electrode in contact with the other surface of the ferroelectric film. At least one of the upper electrode and the lower electrode has a stacked electrode structure in which one or more oxide conductive layers and one or more metal layers are stacked alternately, and the stacked electrode structure includes at least one of two or more oxide conductive layers and two or more metal layers.

13 Claims, 12 Drawing Sheets

FIG. 5

| Upper electrode / Lower electrode | First Example (FIG. 4A) | Second Example (FIG. 4B) | Third Example (FIG. 4C) | Fourth Example (FIG. 4D) | Fifth Example (FIG. 4E) | Sixth Example (FIG. 4F) | Seventh Example (FIG. 4G) |
|---|---|---|---|---|---|---|---|
| First Example (FIG. 3A) | ○ | ○ | ○ | ○ | ○ | ○ | ○ |
| Second Example (FIG. 3B) | ○ | ○ | ○ | ○ | ○ | ○ | ○ |
| Third Example (FIG. 3C) | ○ | ○ | ○ | ○ | ○ | ○ | ○ |
| Fourth Example (FIG. 3D) | ○ | ○ | ○ | ○ | ○ | ○ | ○ |
| Fifth Example (FIG. 3E) | ○ | ○ | ○ | ○ | ○ | ○ | ○ |
| Sixth Example (FIG. 3F) | ○ | ○ | ○ | ○ | ○ | ○ | ○ |
| Seventh Example (FIG. 3G) | ○ | ○ | ○ | ○ | ○ | ○ | × |

FERROELECTRIC CAPACITOR

CROSS-REFERENCE TO RELATED APPLICATION

This application is a continuation of U.S. patent application Ser. No. 13/491,834 filed on Jun. 8, 2012 which is based upon and claims the benefit of priority from Japanese Patent Application No. 2011-128605, filed on Jun. 8, 2011, the entire contents of which are incorporated herein by reference.

TECHNICAL FIELD

The present disclosure relates to a ferroelectric capacitor including a ferroelectric film as a capacitive film.

BACKGROUND

A ferroelectric capacitor includes an upper electrode, a lower electrode and a ferroelectric film disposed between the upper and lower electrodes. Such a ferroelectric capacitor is used as a pixel of a display device or a capacitor of a nonvolatile memory cell. The upper electrode is configured to have a two-layered structure, for example. Specifically, an $IrO_2$ film is formed on the ferroelectric film by using a sputtering process and then an Ir film is formed on the $IrO_2$ film by also using a sputtering process.

In a process performed after forming the ferroelectric capacitor, the ferroelectric capacitor is often exposed to a reducing atmosphere. Specifically, when forming an inter-layer dielectric film made of $SiO_2$ by using a plasma CVD (Chemical Vapor Deposition) process, a semi-finished product including a ferroelectric capacitor is exposed to a reducing atmosphere containing a large amount of hydrogen and hydrogen radicals. In some cases, a miniaturized device may use a tungsten (W) plug having a high buriability, and such tungsten plug is formed under a reducing atmosphere. Specifically, when forming a tungsten plug that contacts with an upper electrode, by using a CVD process, a raw material gas including $WF_6$ is reduced to its elements using hydrogen or silane. Accordingly, the semi-finished product including the ferroelectric capacitor is exposed to the reducing atmosphere.

Since a ferroelectric film is often made of a metal oxide such as PZT (lead zirconate titanate), characteristics of the ferroelectric film are deteriorated when it is exposed to the reducing atmosphere. Accordingly, there is provided a method to prevent the reducing atmosphere from being introduced into the ferroelectric film by forming a conductive hydrogen barrier film on the upper electrode.

In the above method, the conductive hydrogen barrier film is formed with an amorphous film made of IrTa. However, the use of such an additional amorphous film complicates the entire process. In particular, when etching the conductive hydrogen barrier film, the upper electrode, the ferroelectric film and the lower electrode into a common pattern, it may be difficult to obtain an appropriate etching selectivity between the conductive hydrogen barrier film and the ferroelectric film to form a fine pattern.

On the other hand, when omitting the conductive hydrogen barrier film, the upper electrode is readily exposed to the reducing atmosphere. If the upper electrode has a structure including an $IrO_2$ film and an Ir film formed thereon by a sputtering process, the Ir film is grown into a columnar crystalline structure. Accordingly, the reducing atmosphere reaching the upper electrode continues to make contact with the $IrO_2$ film through the grain boundary and reduces the $IrO_2$ film. As a result, the $IrO_2$ film loses oxygen therein and becomes a porous film mainly made of iridium metal. This may cause decrease in the contact area between the upper electrode and the ferroelectric film and deterioration of characteristics of the ferroelectric film due to the reducing atmosphere making contact with the ferroelectric film. Thus, the characteristics (particularly, capacitance) of the ferroelectric capacitor as required in the design cannot be provided.

The above problem has not been notable and considered when a capacitor area remains to be about 6 $\mu m^2$ (2 $\mu m \times 3$ $\mu m$) or greater. However, such problem particularly becomes notable in devices having a capacitor area of equal to or less than 1 $\mu m^2$ (for example, 0.85 $\mu m^2$). Specifically, while measuring characteristics of trial-manufactured ferroelectric capacitors having an area of equal to or less than 1 $\mu m^2$, the above-mentioned problem resulted in a failure of obtaining designed characteristics of the trial-manufactured ferroelectric capacitors.

SUMMARY

The present disclosure provides some embodiments of a ferroelectric capacitor having a structure capable of preventing deterioration of characteristics of the ferroelectric capacitor due to a reducing atmosphere.

According to one embodiment of the present disclosure, there is provided a ferroelectric capacitor including: a ferroelectric film; a lower electrode in contact with one surface of the ferroelectric film; and an upper electrode in contact with the other surface of the ferroelectric film, wherein at least one of the upper electrode and the lower electrode has a stacked electrode structure in which one or more oxide conductive layers and one or more metal layers are stacked alternately, and the stacked electrode structure includes at least one of two or more oxide conductive layers and two or more metal layers.

In some embodiments, the stacked electrode structure may include at least two oxide conductive layers and at least one metal layer and has a sandwich structure in which one metal layer is interposed between two adjacent oxide conductive layers. For example, the stacked electrode structure includes a three-layered structure including a first and a second oxide conductive layer and one metal layer interposed therebetween. In this case, though the first oxide conductive layer disposed farther from the ferroelectric film than the second oxide conductive layer may be reduced to become porous by a reducing atmosphere, the first oxide conductive layer consumes the reducing atmosphere to prevent the reducing atmosphere from reaching the ferroelectric film. Further, even if some reducing atmosphere passes through the first oxide conductive layer and reaches the metal layer, the metal layer prevents the reducing atmosphere from reaching the second oxide conductive layer. This prevents the second oxide conductive layer from being damaged due to the reducing atmosphere. Accordingly, since both the second oxide conductive layer and the ferroelectric film are kept robust, the contact area therebetween can be sufficiently secured and deterioration of the characteristics of the ferroelectric film can be effectively prevented, which may result in prevention of deterioration of the characteristics of the ferroelectric capacitor. More specifically, since the amount of hydrogen reaching the ferroelectric film is decreased, residual polarization and data maintenance properties can be improved. In addition, since the electrode has not only an oxide conductive portion but also a metallic portion, the total resistivity of the electrode is low, which may result in a ferroelectric capacitor having an excellent property. In addition, since an additional layer such as a conductive hydrogen barrier layer needs not to be provided, the manufacturing process can be simplified and micro-processing can be facilitated.

In some embodiments, the stacked electrode structure may include at least one oxide conductive layer and at least two metal layers and has a sandwich structure in which one oxide conductive layer is interposed between two adjacent metal layers. For example, the stacked electrode structure includes a three-layered structure including a first and a second metal layer and one oxide conductive layer interposed therebetween. Although a reducing atmosphere may reach the oxide conductive layer through metallic crystalline grain boundaries of the first metal layer disposed farther from the ferroelectric film than the second metal layer is, the amount of the reducing atmosphere reaching the oxide conductive layer is restricted by the first metal layer. Accordingly, even if the oxide conductive layer is partially reduced, the robustness of the electrode is not lost. If voids are generated in a partially reduced portion of the oxide conductive layer, the reducing atmosphere may reach the second metal layer that is in contact with the ferroelectric film through the voids. However, the amount of the reducing atmosphere which may reach the ferroelectric film through the metallic crystalline grain boundaries of the second metal layer may be too small to cause deterioration of the characteristics of the ferroelectric film. Further, since the ferroelectric film is in contact with the second metal layer, the contact area therebetween is not affected by the reducing atmosphere. Accordingly, since the contact area between the electrode and the ferroelectric film can be sufficiently secured and deterioration of the characteristics of the ferroelectric film can be prevented, deterioration of the characteristic of the ferroelectric capacitor can be prevented. More specifically, since an amount of hydrogen reaching the ferroelectric film is decreased, residual polarization and data maintenance properties can be improved. In addition, since the electrode has not only an oxide conductive portion but also a metallic portion, the total resistivity of the electrode is low, which may result in a ferroelectric capacitor having an excellent property. In addition, since an additional layer such as a conductive hydrogen barrier layer needs not to be provided, the manufacturing process can be simplified and micro-processing can be facilitated.

Examples of oxide conductive material forming the oxide conductive layer may include noble metal oxides having high melting points, e.g., $IrO_2$, $SrRuO_3$ and $RuO_2$. Examples of metal material forming the metal layer may include noble metals having high melting points, e.g., iridium (Ir), platinum (Pt) and ruthenium (Ru). The ferroelectric film may be made of ferroelectric material having characteristics in which polarized state generated by an application of an electric field is kept even after the electric field is removed and the direction of polarization is changed according to a direction of the electric field. In particular, the material may have a large residual polarization, a small coercive field and high rectangularity ratio hysteresis. The ferroelectric material is generally metallic oxide. Specifically, examples of the ferroelectric film may include a lead zirconate titanate (PZT) film, a lead lanthanum-doped zirconate titanate (PLZT) film, a barium strontium titanate (BST) film, a strontium bismuth tantalate (SBT) film, a bismuth lanthanum titanate (BLT: (Bi, La)$_4$Ti$_3$O$_{12}$) film, a strontium barium niobate (SBN) film, lithium niobate (LiNbO$_3$) film, a barium titanate (TiBaO$_3$) film, a lanthanum strontium copper oxide (LSCO) film, a kalium dihydrogen phosphate (KDP) film, a kalium tantalum niobate (KTN) film, a lead magnesium niobrate titanate (PMN-PT) ceramics film and a lead zinc niobate titanate (PZN-PT) ceramics film. The ferroelectric film may be formed of one or two or more of these films.

In some embodiments, one of the oxide conductive layers in the stacked electrode structure may be in contact with the ferroelectric film. With this configuration, since the oxide conductive layer made of oxide conductive material is in contact with the ferroelectric film, the reducing atmosphere can be effectively prevented from reaching the ferroelectric film, which may result in prevention of deterioration of the characteristics of the ferroelectric film.

In some embodiments, one of the metal layers in the stacked electrode structure may be in contact with the ferroelectric film. With this configuration, since the metal layer made of metal material is in contact with the ferroelectric film, the contact resistance between the metal layer and the ferroelectric film can be lowered while preventing decrease in the contact area therebetween due to the reducing atmosphere, which makes it possible to improve the characteristics of the ferroelectric capacitor.

In some embodiments, the stacked electrode structure may include two or more oxide conductive layers, and a first oxide conductive layer has a higher oxygen composition than a second oxide conductive layer, the first oxide conductive layer being closer to the ferroelectric film than the second oxide conductive layer is. With this configuration, since the oxygen compositions of the oxide conductive layers increased as it becomes closer to the ferroelectric film, the reducing atmosphere is more likely to be consumed by the oxide conductive layers and is accordingly hard to reach the ferroelectric film. This can provide more reliable prevention of deterioration of the characteristics of the ferroelectric film.

In some embodiments, each of the oxide conductive layers may be thicker than each of the metal layers in contact with said each of the oxide conductive layers. With this embodiment, since the oxide conductive layer is relatively thick and accordingly the reducing atmosphere is likely to be absorbed into the oxide conductive layer, the reducing atmosphere can be prevented from reaching the ferroelectric film.

In some embodiments, the oxide conductive layers may be made of oxide of metal forming the metal layers. With this configuration, the oxide conductive layer and the metal layer can be formed by sputtering using the same target in the same chamber. That is, since the oxide conductive layer and the metal layer can be formed only by switching the atmospheres, transfer between chambers is not required, which may result in high productivity.

In some embodiments, the oxide conductive layers may be made of iridium oxide and the metal layers may be made of iridium. In some embodiments, an area of the upper electrode may be equal to or less than 1 µm². Even in case of such a fine ferroelectric capacitor, according to the present disclosure, deterioration of the characteristics of the ferroelectric capacitor due to a reducing atmosphere can be avoided.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a table showing possible combinations of the first to the seventh example configuration of the upper electrode and the first to the seventh example configuration of the lower electrode.

DETAILED DESCRIPTION

Figure 1:
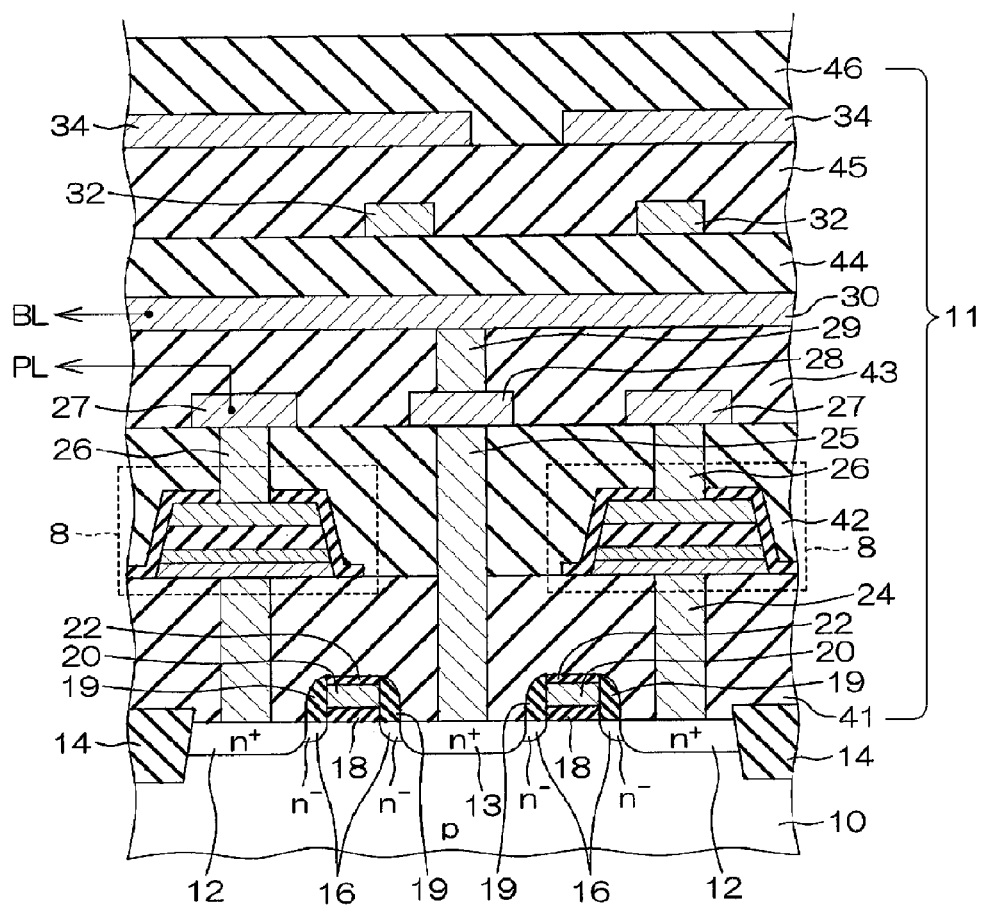
FIG. 1 is a sectional view showing a configuration of a ferroelectric memory device including a ferroelectric capacitor according to one embodiment of the present disclosure.

Reference will now be made in detail to various embodiments, examples of which are illustrated in the accompanying drawings. In the following detailed description, numerous specific details are set forth in order to provide a thorough understanding of the inventive aspects of present disclosure. However, it will be apparent to one of ordinary skill in the art that the inventive aspects of present disclosure may be practiced without these specific details. In other instances, well-known methods, procedures, systems, and components have not been described in detail so as not to unnecessarily obscure aspects of the various embodiments. Also, the same or equal elements in the drawings are indicated by the same reference numerals, and their descriptions are not provided.

FIG. 1 is a sectional view showing a configuration of a ferroelectric memory device including a ferroelectric capacitor according to one embodiment of the present disclosure. The ferroelectric memory device includes a semiconductor substrate 10 and a multi-layered wiring structure 11 formed on the semiconductor substrate 10. The multi-layered wiring structure 11 has ferroelectric capacitor stacked structure 8 formed therein. The multi-layered wiring structure 11 may have four metal layers, i.e., a first to a fourth metal layer.

Memory cell transistors formed with MOSFETs (Metal Oxide Semiconductor Field Effect Transistors) are formed on the semiconductor substrate 10. In this embodiment, the semiconductor substrate 10 is made of a p type semiconductor, and active regions electrically isolated with each other by device isolation regions 14 are formed on a surface layer portion of the semiconductor substrate 10. $n^+$ diffusion regions are disposed in each of the active regions, where source or drain regions (S/D regions) 12 and 13 are formed and $n^-$ high resistive regions 16 are formed at periphery regions of the S/D regions 12 and 13. The $n^-$ high resistive regions 16 helps reducing the leak currents in the vicinity of the S/D regions 12 and 13 and maintaining withstand voltages.

A gate insulating film 18 is formed on the semiconductor substrate 10 between two adjacent the S/D regions 12 and 13, a gate electrode 20 is formed on the gate insulating film 18, and a cap insulating film 22 is formed on the gate electrodes 20. Further, a sidewall insulating film 19 is formed on side walls of the gate insulating film 18, the gate electrode 20 and the cap insulating film 22.

A plug electrode 25 is formed on and bonded to the S/D region 13 within the multi-layered wiring structure 11. The plug electrode 25 is connected to an electrode 30 formed in the second metal layer via an electrode 28 formed in the first metal layer and a via electrode 29 formed on the electrode 28. The electrode 30 is connected to a bit line BL.

A plug electrode 24 is formed on the S/D region 12 within the multi-layered wiring structure 11. The bottom end of the plug electrode 24 is attached to the S/D region 12 and the top end of the plug electrode 24 is connected to the ferroelectric capacitor stacked structure 8 formed in the multi-layered wiring structure 11. In the multi-layered wiring structure 11, a via electrode 26 is formed on the ferroelectric capacitor stacked structure 8. The bottom end of the via electrode 26 is connected to the ferroelectric capacitor stacked structure 8, and the top end of the via electrode 26 is connected to an electrode 27 formed in the first metal layer. The electrode 27 is connected to a plate line PL of the ferroelectric memory device.

The multi-layered wiring structure 11 is a three-dimensional wiring structure where layers are electrically insulated from each other by interlayer dielectric films 41-46. The above-mentioned electrodes are isolated from each other by the interlayer dielectric films 41 to 43.

The interlayer dielectric film 44 is disposed on the electrode 30 formed in the second metal layer. An electrode 32 of the third metal layer is formed on the interlayer dielectric film 44 and covered by the interlayer dielectric film 45. An electrode 34 of the fourth metal layer is formed on the interlayer dielectric film 45 and covered by the interlayer dielectric film 46. Though the multi-layered wiring structure 11 in this embodiment has four metal layers, i.e., the first to fourth metal layer, the multi-layered wiring structure 11 is not limited thereto but may have, for example, two, three, five, six or more metal layers. The number of metal layers may be appropriately determined depending on a scale of wiring, for example.

A connection between two electrodes formed in different metal layers is achieved by interposing therebetween a via electrodes formed by, e.g., a damascene process.

In FIG. 1, two memory cell transistors formed with MOSFETs having the S/D region 13 as the common region are formed in the active region. The S/D region 13 is connected to the electrode 30 connected to the bit line BL. The pair of S/D regions 12 is connected to a pair of electrodes 27 connected to the plate line PL via a pair of ferroelectric capacitors, each of which is formed by the ferroelectric capacitor stacked structure 8. This results in two ferroelectric memory cells of a single transistor-single capacitor structure having the electrode 30 connected to the plate line PL as the common wiring.

Figure 2:
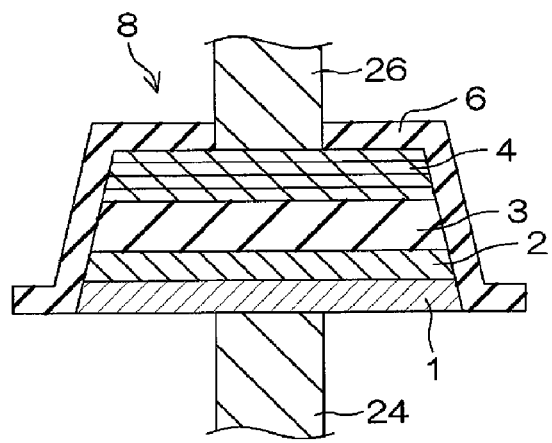
FIG. 2 is a sectional view showing an example configuration of a ferroelectric capacitor stacked structure.

FIG. 2 is a sectional view showing an example configuration of the ferroelectric capacitor stacked structure 8. The ferroelectric capacitor stacked structure 8 includes a conductive barrier film 1 connected to the plug electrode 24, a lower electrode 2 stacked on the conductive barrier film 1, a ferroelectric film 3 stacked on the lower electrode 2, and an upper electrode 4 stacked on the ferroelectric film 3. The upper electrode 4 is connected to the via electrode 26, and the lower electrode 2 is electrically connected to the plug electrode 24 via the conductive barrier film 1. The ferroelectric film 3 is disposed such that one surface of the ferroelectric film 3 is in contact with the lower electrode 2 and the other surface of the ferroelectric film 3 is in contact with the upper electrode 4. In addition, an insulating hydrogen barrier film 6 is continuously formed on the top surface of the upper electrode 4 and side walls of the upper electrode 4, the ferroelectric film 3, the lower electrode 2 and the conductive barrier film 1.

The conductive barrier film 1 can be made of $Ir_xTa_{1-x}$ ($0<x<1$), and particularly, in some cases the conductive barrier film 1 is made of amorphous metal. The composition ratio x of iridium in $Ir_xTa_{1-x}$ ($0<x<1$) ranges, for example, between about 0.3 and about 0.5.

The lower electrode 2 has a stacked electrode structure including a metal layer and an oxide conductive layer stacked in order, as will be described below. Examples of metal material of the metal layer may include noble metals having high melting points, e.g., iridium (Ir), platinum (Pt) and ruthenium (Ru). Examples of oxide conductive material of the oxide conductive layer may include noble metal oxides having high melting points, e.g., iridium oxide ($IrO_2$), strontium ruthenate ($SrRuO_3$) and ruthenium oxide ($RuO_2$). For the purpose of simplification of the manufacturing process, the oxide conductive layer is in some cases made of an oxide of the metal material of which the metal layer is made.

The conductive barrier film 1 secures electrical conduction between the plug electrode 24 and the lower electrode 2 while preventing oxidation of the plug electrode 24.

The ferroelectric film 3 may be made of material having characteristics in which a polarized state generated by applying an electric field is kept even after the electric field is removed and the direction of polarization is changed according to a direction of the electric field. In particular, the material may have a large residual polarization, a small coercive field and/or a high rectangularity ratio hysteresis. Specifically, examples of the ferroelectric film 3 may include a lead zirconate titanate (PZT) film, a lead lanthanum-doped zirconate titanate (PLZT) film, a barium strontium titanate (BST) film, a strontium bismuth tantalate (SBT) film, a bismuth lanthanum titanate (BLT, $Bi, La)_4Ti_3O_{12}$) film, a strontium barium niobate (SBN) film, lithium niobate ($LiNbO_3$) film, a barium titanate ($TiBaO_3$) film, a lanthanum strontium copper oxide (LSCO) film, a kalium dihydrogen phosphate (KDP) film, a kalium tantalum niobate (KTN) film, a lead magnesium niobrate titanate (PMN-PT) ceramics film and a lead zinc niobate titanate (PZN-PT) ceramics film.

The upper electrode 4 has a stacked electrode structure including a metal layer and an oxide conductive layer stacked in order, as will be described below. Examples of metal material of the metal layer may include noble metals having high melting points, e.g., iridium (Ir), platinum (Pt) and ruthenium (Ru). Examples of oxide conductive material of the oxide conductive layer may include noble metal oxides having high melting points, e.g., iridium oxide ($IrO_2$), strontium ruthenate ($SrRuO_3$) and ruthenium oxide ($RuO_2$). For the purpose of simplification of the manufacturing process, in some cases the oxide conductive layer is made of an oxide of the metal material of which the metal layer is made.

Examples of the insulating hydrogen barrier film 6 may include an alumina ($Al_2O_3$) film, a silicon nitride ($Si_3N_4$) film and a combination thereof. The insulating hydrogen barrier film 6 maintains electrical isolation between the upper electrode 4 and the lower electrode 2, while protecting the ferroelectric film 3 from hydrogen or hydrogen radical generated during a wiring process or a via electrode forming process, e.g., a process forming the via electrode 26.

The semiconductor substrate 10 may be made of, e.g., silicon (Si), gallium arsenic (GaAs), gallium phosphorus (GaP), gallium nitride (GaN) and silicon carbide (SiC). In addition, the semiconductor substrate 10 may be replaced with a sapphire substrate, a quartz substrate, a silicon on insulator (SOI) substrate or the like.

FIGS. 3A to 3G are schematic sectional views showing various configurations of the upper electrode 4.

Figure 3A:
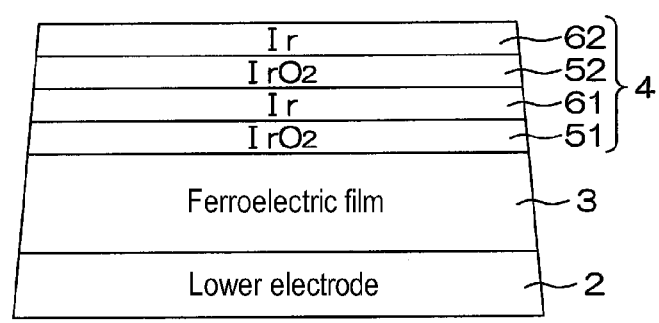
FIG. 3A is a schematic sectional view showing a first example configuration of an upper electrode.

The upper electrode 4 having a first example configuration shown in FIG. 3A includes a first iridium oxide layer 51 (one example of the oxide conductive layer having a thickness of, e.g., 50 nm) in contact with the top surface of the ferroelectric film 3, a first iridium layer 61 (one example of the metal layer having a thickness of, e.g., 25 nm) stacked on the first iridium oxide layer 51, a second iridium oxide layer 52 (having a thickness of, e.g., 50 nm) stacked on the first iridium layer 61, and a second iridium layer 62 (having a thickness of, e.g., 25 nm) stacked on the second iridium oxide layer 52. That is, the upper electrode 4 is formed by alternately stacking an iridium oxide layer and an iridium layer twice.

Figure 3B:
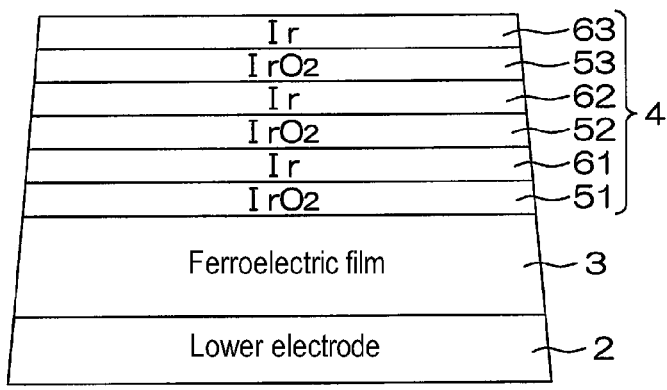
FIG. 3B is a schematic sectional view showing a second example configuration of the upper electrode.

The upper electrode 4 having a second example configuration shown in FIG. 3B includes a first iridium oxide layer 51 (having a thickness of, e.g., 50 nm) in contact with the top surface of the ferroelectric film 3, a first iridium layer 61 (having a thickness of, e.g., 25 nm) stacked on the first iridium oxide layer 51, a second iridium oxide layer 52 (having a thickness of, e.g., 50 nm) stacked on the first iridium layer 61, a second iridium layer 62 (having a thickness of, e.g., 25 nm) stacked on the second iridium oxide layer 52, a third iridium oxide layer 53 (having a thickness of, e.g., 50 nm) stacked on the second iridium layer 62, and a third iridium layer 63 (having a thickness of, e.g., 25 nm) stacked on the third iridium oxide layer 53. That is, the upper electrode 4 is formed by alternately stacking an iridium oxide layer and an iridium layer three times.

Similarly, the upper electrode 4 may be formed by stacking an iridium oxide layer and an iridium layer alternatively four or more times. Further, an additional iridium oxide layer may be stacked on the uppermost iridium layer formed in the last alternatively stacking of the iridium layer and the iridium oxide layer.

Figure 3C:
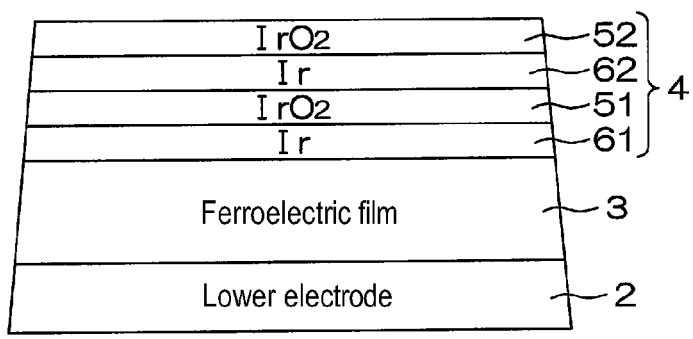
FIG. 3C is a schematic sectional view showing a third example configuration of the upper electrode.

The upper electrode 4 having a third example configuration shown in FIG. 3C includes a first iridium layer 61 (having a thickness of, for e.g., 25 nm) in contact with the top surface of the ferroelectric film 3, a first iridium oxide layer 51 (having a thickness of, e.g., 50 nm) stacked on the first iridium layer 61, a second iridium layer 62 (having a thickness of, e.g., 25 nm) stacked on the first iridium oxide layer 51, and a second iridium oxide layer 52 (having a thickness of, e.g., 50 nm) stacked on the second iridium layer 62. That is, the upper electrode 4 is formed by alternately stacking an iridium layer and an iridium oxide layer twice.

Figure 3D:
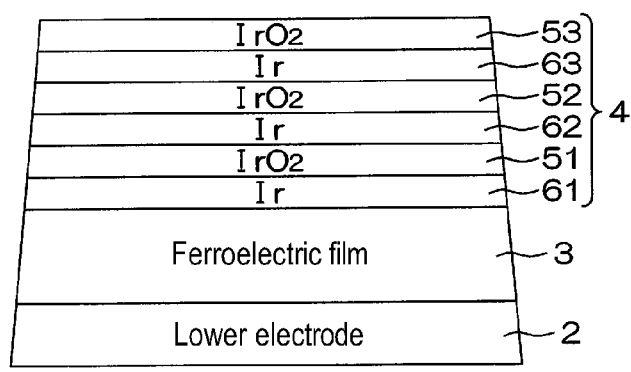
FIG. 3D is a schematic sectional view showing a fourth example configuration of the upper electrode.

The upper electrode 4 having a fourth example configuration shown in FIG. 3D includes a first iridium layer 61 (having a thickness of, e.g., 25 nm) in contact with the top surface of the ferroelectric film 3, a first iridium oxide layer 51 (having a thickness of, e.g., 50 nm) stacked on the first iridium layer 61, a second iridium layer 62 (having a thickness of, e.g., 25 nm) stacked on the first iridium oxide layer 51, a second iridium oxide layer 52 (having a thickness of, e.g., 50 nm) stacked on the second iridium layer 62, a third iridium layer 63 (having a thickness of, e.g., 25 nm) stacked on the second iridium oxide layer 52, and a third iridium oxide layer 53 (having a thickness of, e.g., 50 nm) stacked on the third iridium layer 63. That is, the upper electrode 4 is formed by alternately stacking an iridium layer and an iridium oxide layer three times.

Similarly, the upper electrode 4 may be formed by stacking an iridium layer and an iridium oxide layer alternatively four or more times. Further, an additional iridium layer may be stacked on the uppermost iridium oxide layer formed in the last alternatively stacking of the iridium layer and the iridium oxide layer.

Figure 3E:
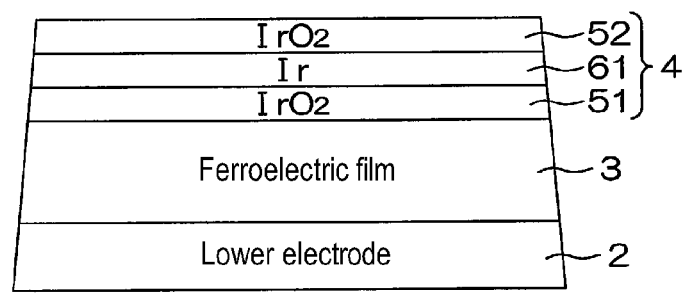
FIG. 3E is a schematic sectional view showing a fifth example configuration of the upper electrode.

The upper electrode 4 having a fifth example configuration shown in FIG. 3E includes a first iridium oxide layer 51 (having a thickness of, e.g., 50 nm) in contact with the top surface of the ferroelectric film 3, an iridium layer 61 (having a thickness of, e.g., 25 nm) stacked on the first iridium oxide layer 51, and a second iridium oxide layer 52 (having a thickness of, e.g., 50 nm) stacked on the iridium layer 61. That is, the upper electrode 4 has a sandwich structure in which the iridium layer 61 is interposed between the iridium oxide layers 51 and 52. Such a sandwich structure is also included in each of the upper electrodes 4 having the first to the fourth example configuration shown in FIGS. 3A to 3D. That is, the sandwich structure shown in FIG. 3E corresponds to the elementary unit of the upper electrode 4.

Figure 3F:
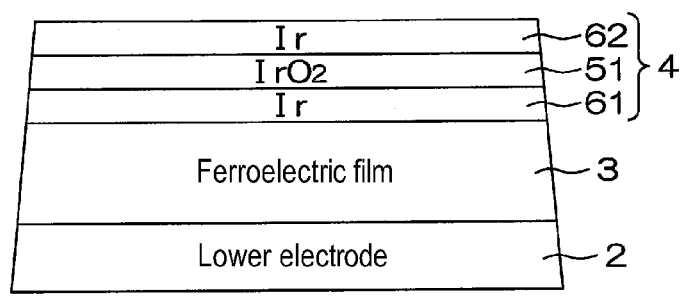
FIG. 3F is a schematic sectional view showing a sixth example configuration of the upper electrode.

The upper electrode 4 having a sixth example configuration shown in FIG. 3F includes a first iridium layer 61 (having a thickness of, e.g., 25 nm) in contact with the top surface of the ferroelectric film 3, an iridium oxide layer 51 (having a thickness of, e.g., 50 nm) stacked on the first iridium layer 61, and a second iridium layer 62 (having a thickness of, e.g., 25 nm) stacked on the iridium oxide layer 51. That is to say, the upper electrode 4 has a sandwich structure in which the iridium oxide layer 51 is interposed between the iridium layers 61 and 62. Such a sandwich structure is also included in each of the upper electrodes 4 having the first to the fourth example configuration shown in FIGS. 3A to 3D. That is to say, the sandwich structure shown in FIG. 3F corresponds to another elementary unit of the upper electrode 4.

Figure 3G:
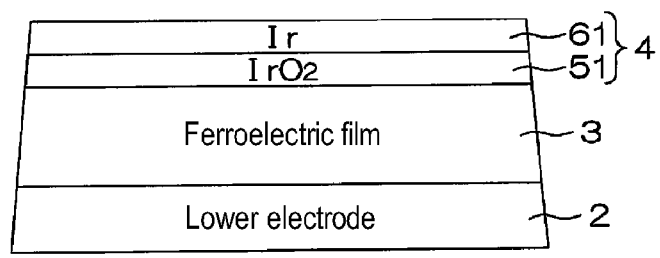
FIG. 3G is a schematic sectional view showing a seventh example configuration of the upper electrode.

The upper electrode 4 having a seventh example configuration shown in FIG. 3G includes an iridium oxide layer 51 in contact with the top surface of the ferroelectric film 3 and an iridium layer 61 stacked on the iridium oxide layer 51. This two-layered structure corresponds to the elementary unit of each of the upper electrodes 4 having the first to the sixth example configuration.

FIGS. 4A to 4G are schematic sectional views showing various configurations of the lower electrode 2.

Figure 4A:
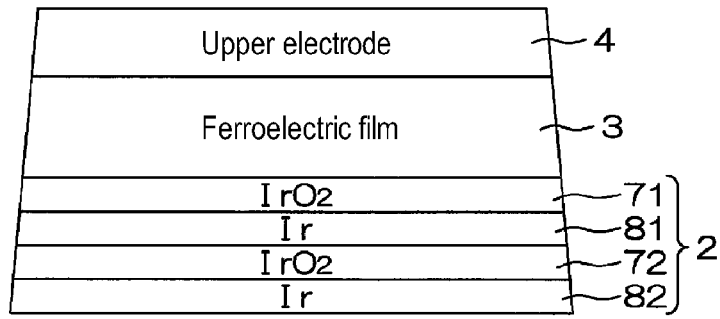
FIG. 4A is a schematic sectional view showing a first example configuration of a lower electrode.

The lower electrode 2 having a first example configuration shown in FIG. 4A includes a first iridium oxide layer 71 (having a thickness of, e.g., 50 nm) in contact with the bottom surface of the ferroelectric film 3, a first iridium layer 81 (having a thickness of, e.g., 25 nm) stacked on the bottom surface of the first iridium oxide layer 71, a second iridium oxide layer 72 (having a thickness of, e.g., 50 nm) stacked on the bottom surface of the first iridium layer 81, and a second iridium layer 82 (having a thickness of, e.g., 25 nm) stacked on the bottom surface of the second iridium oxide layer 72. That is, the lower electrode 2 is formed by alternately stacking an iridium oxide layer and an iridium layer on the bottom surface of the ferroelectric film 3 twice.

Figure 4B:
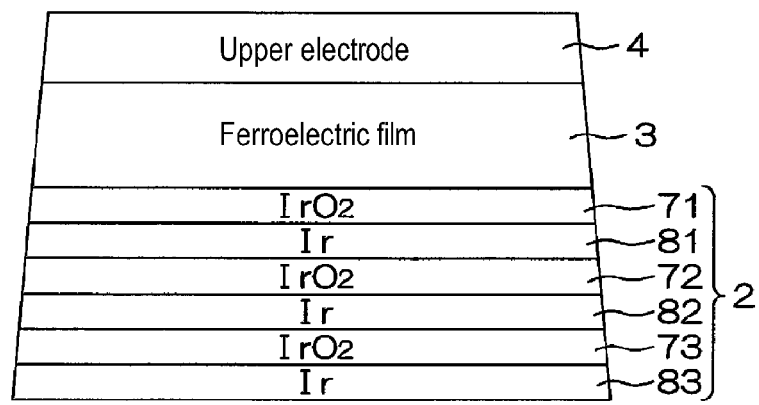
FIG. 4B is a schematic sectional view showing a second example configuration of the lower electrode.

The lower electrode 2 having a second example configuration shown in FIG. 4B includes a first iridium oxide layer 71 (having a thickness of, for e.g., 50 nm) in contact with the bottom surface of the ferroelectric film 3, a first iridium layer 81 (having a thickness of, e.g., 25 nm) stacked on the bottom surface of the first iridium oxide layer 71, a second iridium oxide layer 72 (having a thickness of, e.g., 50 nm) stacked on the bottom surface of the first iridium layer 81, a second iridium layer 82 (having a thickness of, e.g., 25 nm) stacked on the bottom surface of the second iridium oxide layer 72, a third iridium oxide layer 73 (having a thickness of, e.g., 50 nm) stacked on the bottom surface of the second iridium layer 82, and a third iridium layer 83 (having a thickness of, e.g., 25 nm) stacked on the bottom surface of the third iridium oxide layer 73. That is, the lower electrode 2 is formed by alternately stacking an iridium oxide layer and an iridium layer on the bottom surface of the ferroelectric film 3 three times.

Similarly, the lower electrode 2 may be formed by stacking an iridium oxide layer and an iridium layer on the bottom surface of the ferroelectric film 3 alternatively four or more times. Further, an additional iridium oxide layer may be stacked on the bottom surface of the lowermost iridium layer formed in the last alternatively stacking of the iridium oxide layer and the iridium layer.

Figure 4C:
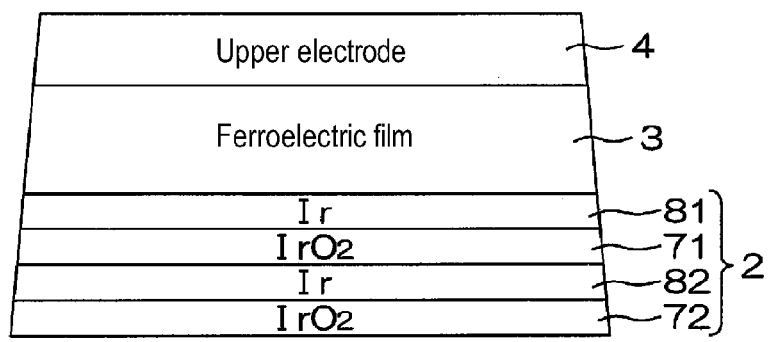
FIG. 4C is a schematic sectional view showing a third example configuration of the lower electrode.

The lower electrode 2 having a third example configuration shown in FIG. 4C includes a first iridium layer 81 (having a thickness of, e.g., 25 nm) in contact with the bottom surface of the ferroelectric film 3, a first iridium oxide layer 71 (having a thickness of, e.g., 50 nm) stacked on the bottom surface of the first iridium layer 81, a second iridium layer 82 (having a thickness of, e.g., 25 nm) stacked on the bottom surface of the first iridium oxide layer 71, and a second iridium oxide layer 72 (having a thickness of, e.g., 50 nm) stacked on the bottom surface of the second iridium layer 82. That is, the lower electrode 2 is formed by alternately stacking an iridium layer and an iridium oxide layer on the bottom surface of ferroelectric film 3 twice.

Figure 4D:
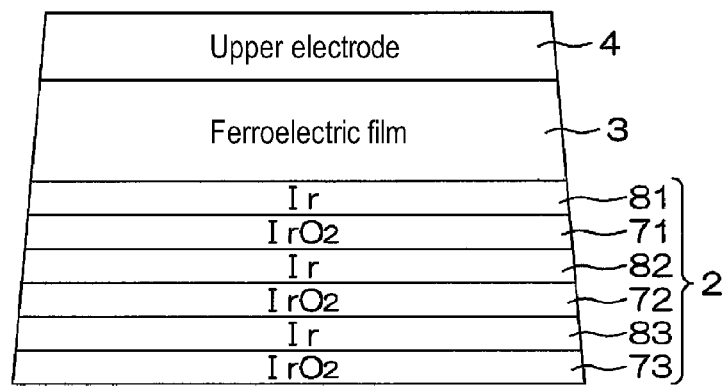
FIG. 4D is a schematic sectional view showing a fourth example configuration of the lower electrode.

The lower electrode 2 having a fourth example configuration shown in FIG. 4D includes a first iridium layer 81 (having a thickness of, e.g., 25 nm) in contact with the bottom surface of the ferroelectric film 3, a first iridium oxide layer 71 (having a thickness of, e.g., 50 nm) stacked on the bottom surface of the first iridium layer 81, a second iridium layer 82 (having a thickness of, e.g., 25 nm) stacked on the bottom surface of the first iridium oxide layer 71, a second iridium oxide layer 72 (having a thickness of, e.g., 50 nm) stacked on the bottom surface of the second iridium layer 82, a third iridium layer 83 (having a thickness of, e.g., 25 nm) stacked on the bottom surface of the second iridium oxide layer 72, and a third iridium oxide layer 73 (having a thickness of, e.g., 50 nm) stacked on the bottom surface of the third iridium layer 83. That is, the lower electrode 2 is formed by alternately stacking an iridium layer and an iridium oxide layer on the bottom surface of the ferroelectric film 3 three times.

Similarly, the lower electrode 2 may be formed by stacking an iridium layer and an iridium oxide layer alternatively four or more times. Further, an additional iridium layer may be stacked on the bottom surface of the lowermost iridium oxide layer formed in the last alternatively stacking of the iridium layer and the iridium oxide layer.

Figure 4E:
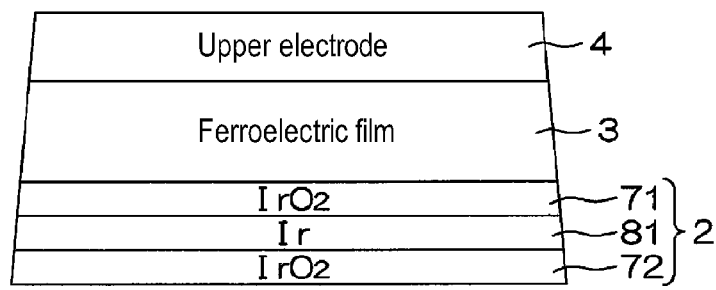
FIG. 4E is a schematic sectional view showing a fifth example configuration of the lower electrode.

The lower electrode 2 having a fifth example configuration shown in FIG. 4E includes a first iridium oxide layer 71 (having a thickness of, e.g., 50 nm) in contact with the bottom surface of the ferroelectric film 3, an iridium layer 81 (having a thickness of, e.g., 25 nm) stacked on the bottom surface of the first iridium oxide layer 71, and a second iridium oxide layer 72 (having a thickness of, e.g., 50 nm) stacked on the bottom surface of the iridium layer 81. That is, the lower electrode 2 has a sandwich structure in which the iridium layer 81 is interposed between the iridium oxide layers 71 and 72. Such a sandwich structure is also included in each of the lower electrodes 2 having the first to the fourth example configuration shown in FIGS. 4A to 4D. That is, the sandwich structure shown in FIG. 4E corresponds to the elementary unit of the lower electrode 2.

Figure 4F:
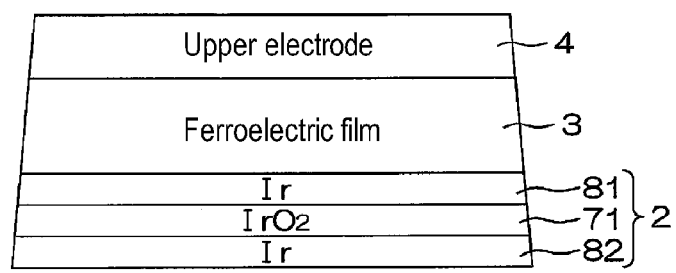
FIG. 4F is a schematic sectional view showing a sixth example configuration of the lower electrode.

The lower electrode 2 having a sixth example configuration shown in FIG. 4F includes a first iridium layer 81 (having a thickness of, e.g., 25 nm) in contact with the bottom surface of the ferroelectric film 3, an iridium oxide layer 71 (having a thickness of, e.g., 50 nm) stacked on the bottom surface of the first iridium layer 81, and a second iridium layer 82 (having a thickness of, e.g., 25 nm) stacked on the bottom surface of the iridium oxide layer 71. That is, the lower electrode 2 has a sandwich structure in which the iridium oxide layer 71 is interposed between the iridium layers 81 and 82. Such a sandwich structure is also included in each of the lower electrodes 2 having the first to the fourth example configuration shown in FIGS. 4A to 4D. That is, the sandwich structure shown in FIG. 4F corresponds to another elementary unit of each of the lower electrodes 2 having the first to the fourth example configuration.

Figure 4G:
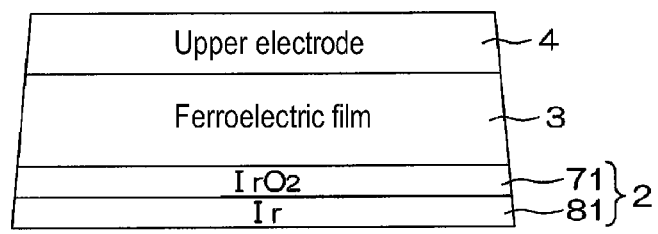
FIG. 4G is a schematic sectional view showing a seventh example configuration of the lower electrode.

The lower electrode 2 having a seventh example configuration shown in FIG. 4G includes an iridium oxide layer 71 (having a thickness of, e.g., 50 nm) in contact with the bottom surface of the ferroelectric film 3, and an iridium layer 81 (having a thickness of, e.g., 25 nm) stacked on the bottom surface of the iridium oxide layer 71. This two-layered structure corresponds to the elementary unit of each of the upper electrodes 4 having the first to the sixth example configuration.

FIG. 5 is a table showing possible combinations of the first to the seventh example configuration of the upper electrode 4 and the first to the seventh example configuration of the lower electrode 2. For combinations of configurations of the upper electrodes 4 in rows and configurations of the lower electrodes 2 in columns, lattices at intersections thereof are filled with symbols "O" and "X" for allowable and unallowable combinations, respectively. That is, combinations other than the combination of the seventh example configuration of the upper electrodes 4 and the seventh example configuration of the lower electrodes 2 are allowed.

Figure 6:
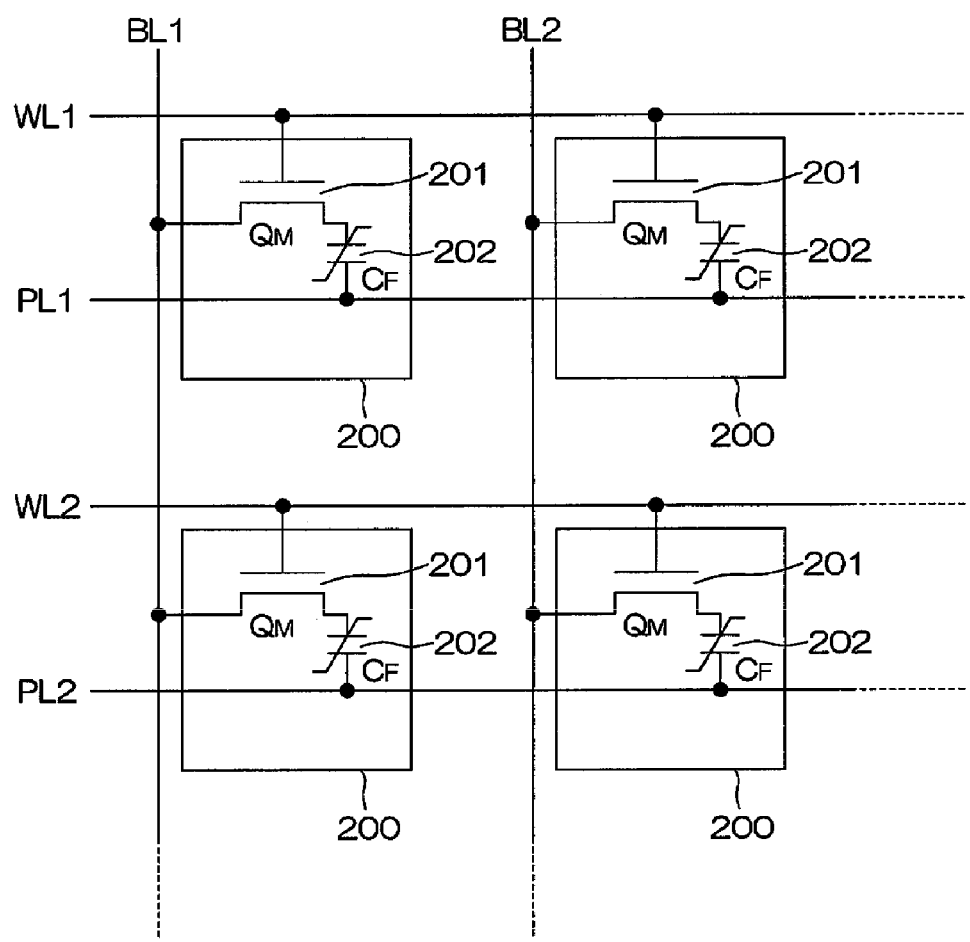
FIG. 6 is an electric circuit diagram showing a configuration of a memory matrix of a ferroelectric memory device.

FIG. 6 is an electric circuit diagram showing a configuration of a memory matrix of the ferroelectric memory device. In FIG. 1, sectional device structures of two ferroelectric memory cells 200 arranged along a single bit line BL is shown. However, the ferroelectric memory device may have a plurality of bit lines including BL1 and BL2 arranged in a direction of column, a plurality of word lines including WL1 and WL2 arranged in a direction of row perpendicular to the bit lines BL1 and BL2, and a plurality of ferroelectric memory cells 200 arranged in a matrix form along the directions of column and row. Each of the ferroelectric memory cells 200 is controlled by one of the bit lines BL1 and BL2 and one of word lines WL1 and WL2.

Each of the ferroelectric memory cells 200 includes a memory cell transistor (MOSFET) 201 ($Q_M$) and a ferroelectric capacitor 202 ($C_F$) connected in series. Read/write operations of the ferroelectric memory cells 200 are controlled by the memory cell transistors 201. In each of the ferroelectric memory cells 200, the gate electrode and the drain electrode of the memory cell transistor 201 are connected to one of the word lines WL1 and WL2 and one of the bit lines BL1 and BL2, respectively, and the source electrode thereof is connected to one electrode of the ferroelectric capacitor 202. The other electrode of the ferroelectric capacitor 202 is connected to one of plate lines including PL1 and PL2. As described above, the upper electrodes of the ferroelectric capacitors 202 are connected to the plate lines PL1 and PL2.

In each of the ferroelectric memory cells 200, data is stored and maintained by using a polarization effect of the ferroelectric film 3. That is, since a polarized state of the ferroelectric film 3 is maintained even after an external electric field is removed, data stored in the ferroelectric memory cell 200 is not lost even after the power supply to the ferroelectric memory device is stopped. This allows the ferroelectric memory cells 200 to act as nonvolatile memories.

In addition, although it has been illustrated in the above description that each of the ferroelectric memory cells 200 has the single transistor-single capacitor structure including one memory cell transistor 201 and one ferroelectric capacitor 202, other structures may be employed. For example, each of the ferroelectric memory cells 200 may have a double transistor-double capacitor structure including two memory cell transistors ($Q_M$) and two ferroelectric capacitors ($C_F$). In addition, a single transistor structure including a ferroelectric capacitor ($C_F$) as a gate capacitor of each memory cell transistor ($Q_M$) may be employed.

Next, a method for manufacturing the ferroelectric memory device will be described in detail with reference to FIGS. 7 to 11.

Figure 7:
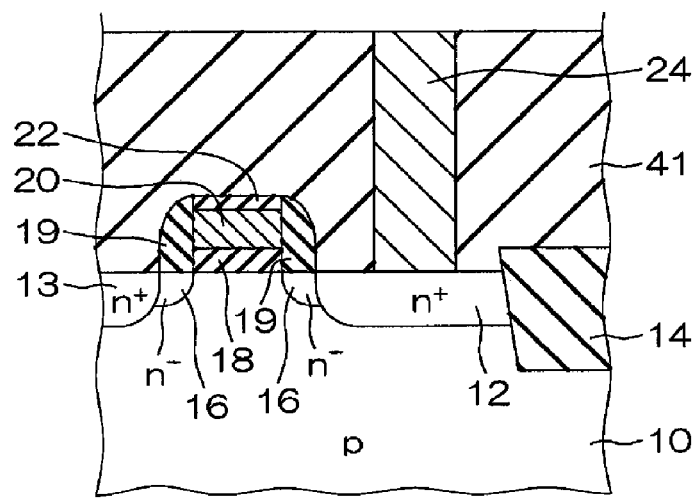
FIG. 7 is a sectional view showing a step in a method of manufacturing the ferroelectric memory device of FIG. 1.

Referring to FIG. 7, a MOSFET is first formed, as a memory cell transistor, on the semiconductor substrate 10 and an interlayer dielectric film 41, e.g., a CVD dielectric film and a TEOS film is then deposited. Thereafter, a contact hole passing through the interlayer dielectric film 41 is formed on an S/D region 12 and filled with a conductor to thereby form a plug electrode 24. The plug electrode 24 is made of metal having a high buriability for fine holes, e.g., tungsten (W).

When the plug electrode 24 is formed as a W-plug, a contact hole having a high aspect ratio is formed in the interlayer dielectric film 41 and filled with the W-plug electrode. The filling of the W electrode may be carried out by using $WF_6$ gas as a raw material gas and reducing the $WF_6$ gas with $H_2$, $SiH_4$ or the like. A reaction for $H_2$ reduction is expressed by equation 1 below:

$$WF_6 + 3H_2 \rightarrow W + 6HF \qquad \text{(Equation 1)}.$$

A reaction for $SiH_4$ reduction is expressed by equation 2 below:

$$2WF_6 + 3SiH_4 \rightarrow 2W + 3SiF_4 + 6H_2 \qquad \text{(Equation 2)}.$$

Therefore, if another W-plug is formed after the ferroelectric capacitor stacked structure 8 is formed, the ferroelectric film 3 is also reduced unless a hydrogen barrier function is provided in the ferroelectric capacitor stacked structure 8.

The MOSFET may be formed by a typical silicon miniaturizing process. For example, the device isolation region 14 is formed by a shallow trench isolation (STI) technique. The gate insulating film 18 is formed by a thermal oxidation process. The S/D regions 12 and 13 and the high resistive region 16 are formed by an arsenic or phosphorus ion implantation or diffusion process. The gate electrode 20 is formed by, e.g., a polysilicon forming technique. In the process of forming the S/D regions 12 and 13 and the gate electrode 20, a tungsten (W), molybdenum (Mo) or cobalt (Co) silicide technique for forming fine contacts may be employed. The sidewall insulating film 19 and the cap insulating film 22 may be formed by using a CVD oxide or nitride film deposition.

Figure 8:
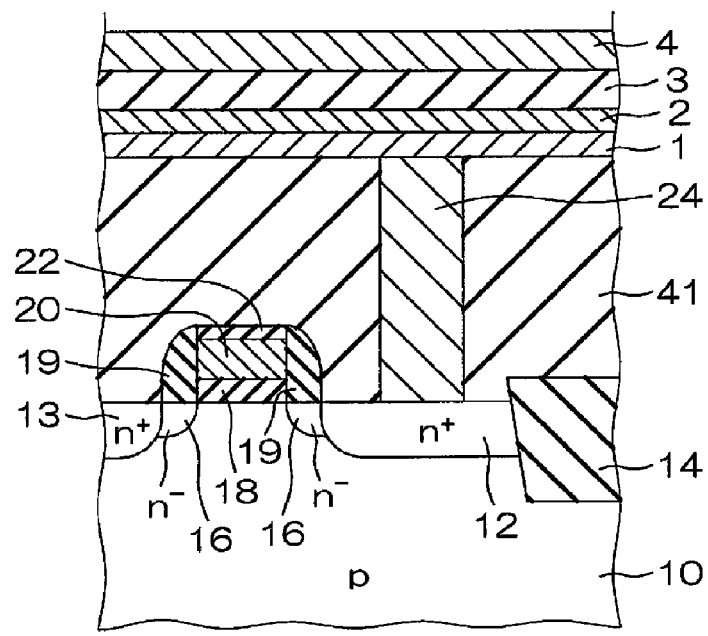
FIG. 8 is a sectional view showing a step subsequent to the step of FIG. 7.

Next, as shown in FIG. 8, the conductive barrier film 1 is formed on the exposed surfaces of the interlayer dielectric film 41 and the plug electrode 24. The conductive barrier film 1 may be made of, e.g., $Ir_xTa_{1-x}$. In particular, the conductive barrier film 1 is preferably made of an amorphous metal. The composition ratio x of iridium in $Ir_xTa_{1-x}$ ranges, for example, between about 0.3 and about 0.5. Since the $Ir_xTa_{1-x}$ film made of the amorphous metal has the hydrogen barrier function, it can act as a hydrogen barrier film when a plug or a via electrode is formed as a W electrode later. As a result, the conductive barrier film 1 can protect the ferroelectric film 3. Further, since the $Ir_xTa_{1-x}$ (0<x<1) film made of the amorphous metal also has an oxygen barrier function, it can prevent the W electrode from being oxidized.

Next, as shown in FIG. 8, the lower electrode 2 is formed on the exposed surface of the conductive barrier film 1. The lower electrode 2 may be formed by sputtering, for example. As described above, the lower electrode 2 has a stacked structure including an iridium (Ir) layer and an iridium oxide ($IrO_2$) layer. Such a lower electrode 2 may be continuously formed in the same chamber by sputtering an iridium target while switching the internal atmosphere of the chamber between an oxygen-free atmosphere (e.g., an inert gas atmosphere such as argon) and an oxygen atmosphere (e.g., a mixture atmosphere of oxygen and inert gas such as argon). Instead, the lower electrode 2 may be formed by using a CVD method or a surface modification (MOD) method such as a sol-gel technique.

Next, as shown in FIG. 8, the ferroelectric film 3 is formed on the exposed surface of the lower electrode 2. For example, the ferroelectric film 3 may be formed by forming a PZT film, a PLZT film, a BST film, an SBT film, a BLT film, an SBN film, a $LiNbO_3$ film, a $TiBaO_3$ film, an LSCO film, a KDP film, a KTN film, a PMN-PT ceramics film or a PZN-PT ceramics film on the lower electrode 2 by using a sputtering method, a metal organic CVD (MOCVD) method or a sol-gel method. Specifically, the PLZT film having a thickness of about several ten nanometers to about 100 nm may be formed by using an MOCVD method.

Next, as shown in FIG. 8, the upper electrode 4 is formed on the exposed surface of the ferroelectric film 3. The upper electrode 4 may be formed by sputtering, for example. As described above, the upper electrode 4 has a stacked structure including an iridium (Ir) layer and an iridium oxide ($IrO_2$) layer. Such an upper electrode 4 may be continuously formed in the same chamber by sputtering an iridium target while switching the internal atmosphere of the chamber between an oxygen-free atmosphere (e.g., an inert gas atmosphere such as argon) and an oxygen atmosphere (e.g., a mixture atmosphere of oxygen and inert gas such as argon). Instead, the upper electrode 4 may be formed by using a CVD method or a MOD method such as a sol-gel method.

Figure 9:
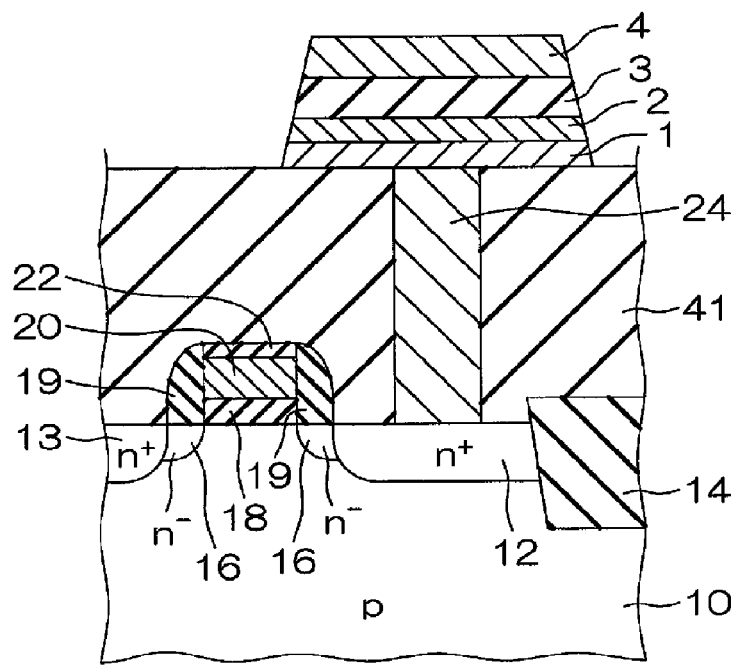
FIG. 9 is a sectional view showing a step subsequent to the step of FIG. 8.

Next, as shown in FIG. 9, a photoresist film is coated on the upper electrode 4, a region where the ferroelectric capacitor is to be formed is defined by a photolithographic technique, and the upper electrode 4, the ferroelectric film 3, the lower electrode 2 and the conductive barrier film 1 are selectively etched by dry etching. In some embodiments the dry etching is carried out by changing the etching gas systems for each layer. Examples of the etching gas systems may include a halogen gas system, e.g., chloride or bromine, and an argon gas system. Specifically, $C_4F_8$ gas, $CF_4$ gas or Ar gas may be used for the PLZT film and $Cl_2$ gas or Ar gas may be used for iridium and iridium oxide, for example.

Figure 10:
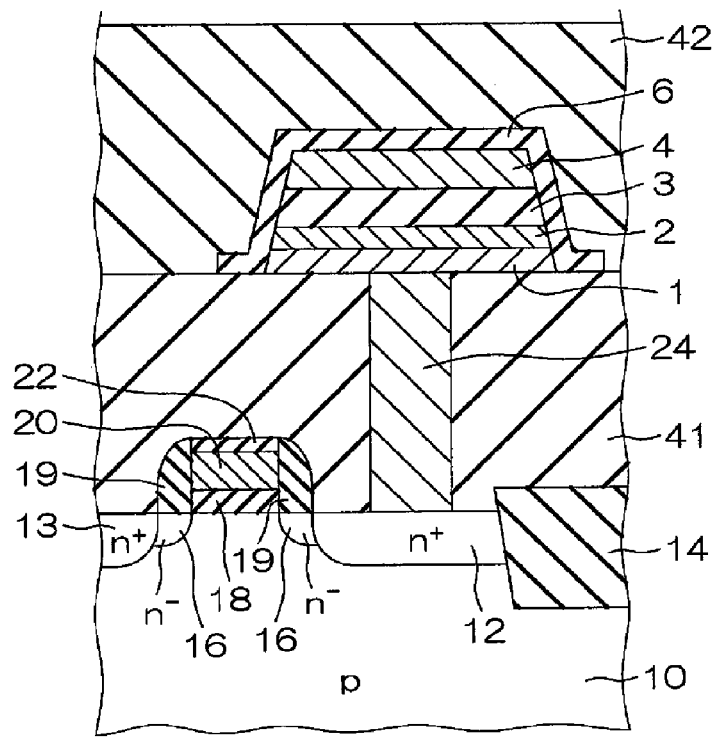
FIG. 10 is a sectional view showing a step subsequent to the step of FIG. 9.

Next, as shown in FIG. 10, the insulating hydrogen barrier film 6 is formed on the exposed surface of the device and then subjected to photography and etching processes to thereby remain only on the top surface of the upper electrode 4, on the side walls of the conductive barrier film 1, the lower electrode 2, the ferroelectric film 3 and the upper electrode 4, and on a portion of the interlayer dielectric film 41. As the insulating hydrogen barrier film 6, an $Al_2O_3$ film, a $Si_3N_4$ film or a combination thereof having a thickness of about several ten nanometers to about 100 nm may be formed by using a CVD or sputtering method.

Next, as shown in FIG. 10, the interlayer dielectric film 42 is formed on the exposed surface of the device. As the interlayer dielectric film 42, an oxide film or a nitride film may be formed by using a CVD method. For example, when the interlayer dielectric film 42 is formed with a $SiO_2$ film by using plasma CVD, $SiH_4$ as a silicon raw material gas is introduced into the chamber and ionized therein to generate a large amount of hydrogen plasma in the chamber, which exposes the ferroelectric capacitor stacked structure 8 to a reducing atmosphere. This can be equally applied to subsequent processes of forming other interlayer dielectric films. Thus, the formed interlayer dielectric film 42 may be subjected to planarization by using a chemical mechanical polishing (CMP) technique.

Figure 11:
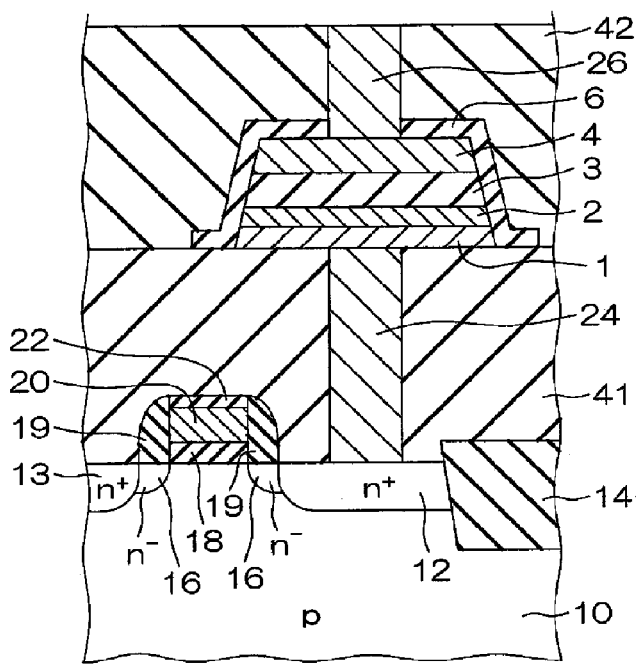
FIG. 11 is a sectional view showing a step subsequent to the step of FIG. 10.

Next, as shown in FIG. 11, after the interlayer dielectric film 42 is formed, the via electrode 26 is formed. Specifically, a contact hole reaching the upper electrode 4 through the interlayer dielectric film 42 and the insulating hydrogen barrier film 6 is formed and filled with the above-mentioned conductive material which becomes the via electrode 26. If the aspect ratio of the contact hole is high, metal having a high buriability, e.g., W and Cu, may be employed as the conductive material. A process of forming the via electrode 26 as a W-plug is almost the same as that for the plug electrode 24, and therefore, the explanation of which will be omitted. However, in the process of forming the via electrode 26, before filling of the W-plug, a barrier layer including a Ti film and a TiN film stacked in order from bottom is formed on the exposed surface of the upper electrode 24 and a side wall of the contact hole. Then, the contact hole is completely filled with the W-plug such that the W-plug is in contact with the barrier layer. In order to prevent oxidation of the barrier layer, the uppermost layer of the upper electrode 4 is preferably formed with a metal layer, e.g., an iridium layer. This is because, if the uppermost layer of the upper electrode 4 is an oxide conductive layer, it is likely that the barrier layer is oxidized and the contact resistance increases.

In the configuration shown in FIG. 1, the MOSFET region and the electrodes 27, 28 and 34 of the metal layers between which the interlayer dielectric films 41 to 46 are interposed are formed by the same silicon miniaturizing process, and therefore, explanation of which will not be repeated.

Figure 12:
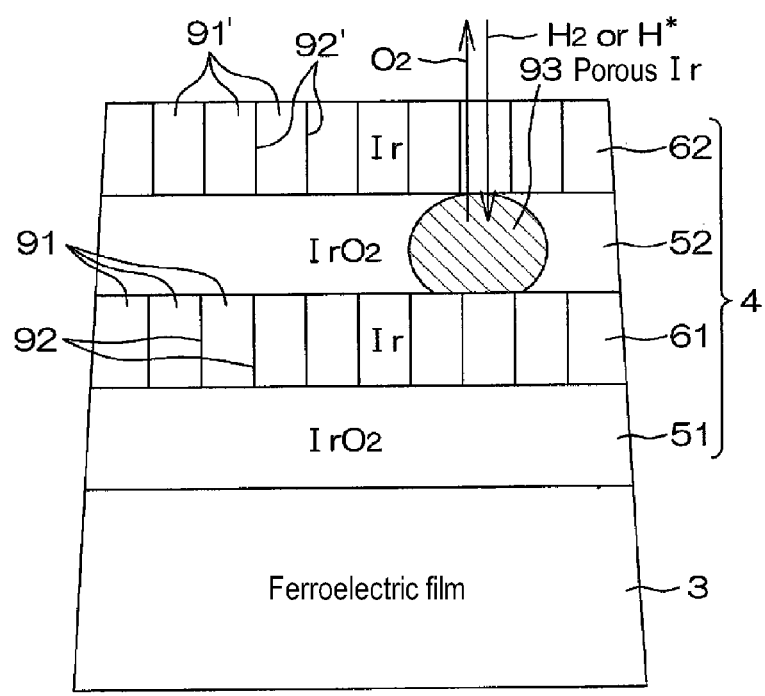
FIG. 12 is a schematic sectional view for explaining a reducing atmosphere block operation by the upper electrode having the first example configuration shown in FIG. 3A.

FIG. 12 is a schematic sectional view for explaining a reducing atmosphere block operation by the upper electrode 4 having the first example configuration shown in FIG. 3A. The first iridium oxide layer 51 is in contact with the top surface of the ferroelectric film 3. Accordingly, if the first iridium oxide layer 51 is kept robust, the contact area between the ferroelectric film 3 and the first iridium oxide layer 51 can be maintained as designed and deterioration of characteristics of the ferroelectric film 3 can be prevented.

If the first and the second iridium layer 61 and 62 are formed by a sputtering method, metal crystals 91 and 91' are grown into columnar shapes and thus metal crystalline grain boundaries 92 and 92' are formed. Meanwhile, if the W electrode and the interlayer dielectric films are exposed, during the formation thereof, to a reducing atmosphere containing a large amount of hydrogen ($H_2$) and hydrogen plasma ($H^*$), the reducing atmosphere may reach the upper electrode 4. This reducing atmosphere reaches the second iridium oxide layer 52 along the crystalline grain boundaries 92' in the second iridium layer 62 and takes oxygen away from the second iridium oxide layer 52. Accordingly, iridium oxide is reduced to iridium and voids are generated in the second iridium oxide layer 52. Thus, a porous iridium region 93 including the voids is formed in the second iridium oxide layer 52. Even under this state, there is no problem with an electrical connection between the first and the second iridium layers 61 and 62.

The most part of the reducing atmosphere introduced along the crystalline grain boundaries 92' of the second iridium layer 62 is consumed by the second iridium oxide layer 52, and even if left unconsumed, an extremely small amount of the reducing atmosphere reaches the first iridium oxide layer 51 along the crystalline grain boundaries 92 of the first iridium layer 61. This allows the first iridium oxide layer 51 to be kept robust. As a result, since the contact area between the ferroelectric film 3 and the first iridium oxide layer 51 can be maintained as designed and deterioration of characteristics of the ferroelectric film 3 due to the reducing atmosphere can be prevented, the ferroelectric capacitor stacked structure 8 can have characteristics (particularly, capacitance) as designed. In addition, since the upper electrode 4 has not only an oxide conductive portion but also a metallic portion, the total resistivity of the upper electrode 4 is low, which may result in a ferroelectric capacitor having an excellent property.

Considering the upper electrode 4 shown in FIG. 3E in the same manner, though the second iridium oxide layer 52 may be reduced to become porous by the reducing atmosphere, the reduction of the second iridium oxide layer 52 may prevent the reducing atmosphere from reaching the iridium layer 61. Further, even if some reducing atmosphere passes through the second iridium oxide layer 52 and reaches the iridium layer 61, the iridium layer 61 prevents the reducing atmosphere from reaching the first iridium oxide layer 51. This prevents the first iridium oxide layer 51 from being damaged due to the reducing atmosphere. Accordingly, since both of the first iridium oxide layer 51 and the ferroelectric film 3 are kept robust, the contact area therebetween can be sufficiently secured and deterioration of the characteristics of the ferroelectric film 3 can be effectively prevented, which, in turn, may prevent the deterioration of the characteristics of the ferroelectric capacitor stacked structure 8. In addition, since the upper electrode 4 has not only an oxide conductive portion but also a metallic portion, the total resistivity of the upper electrode 4 is low, which may result in a ferroelectric capacitor having an excellent property.

Considering the upper electrode 4 shown in FIG. 3F in the same manner, although a reducing atmosphere may reach the iridium oxide layer 51 through metallic crystalline grain boundaries of the second iridium layer 62, the amount of the reducing atmosphere reaching the iridium oxide layer 51 is restricted by the second iridium layer 62. Accordingly, even if the iridium oxide layer 51 is partially reduced, the robustness of the upper electrode 4 is not lost. If voids are generated in a partially reduced portion of the iridium oxide layer 51, the reducing atmosphere may reach the first iridium layer 61 in contact with the ferroelectric film 3 through the voids. However, the amount of the reducing atmosphere which may reach the ferroelectric film 3 through the metallic crystalline grain boundaries of the first iridium layer 61 may be too small to cause any deterioration of the characteristics of the ferroelectric film 3. Further, since the ferroelectric film 3 is in contact with the first iridium layer 61, the contact area therebetween is not affected by the reducing atmosphere. Accordingly, since the contact area between the upper electrode 4 and the ferroelectric film 3 can be sufficiently secured and any deterioration of the characteristics of the ferroelectric film 3 can be prevented, the deterioration of the characteristics of the ferroelectric capacitor can be prevented. In addition, since the upper electrode 4 has not only an oxide conductive portion but also a metallic portion, the total resistivity of the upper electrode 4 is low, which may result in a ferroelectric capacitor having an excellent property.

Considering any configurations shown in FIGS. 3A to 3F in the same manner, the contact area between the upper electrode 4 and the ferroelectric film 3 can be sufficiently secured and the reducing atmosphere can be effectively prevented from reaching the ferroelectric film 3 through the upper electrode 4. If reduction of the upper electrode 4 by the reducing atmosphere does not significantly affect the characteristics of the ferroelectric capacitor, the upper electrode 4 having the structure shown in FIG. 3G may be employed.

Further, considering any configurations shown in FIGS. 4A to 4F in the same manner, the contact area between the lower electrode 2 and the ferroelectric film 3 can be sufficiently secured and the reducing atmosphere can be effectively prevented from reaching the ferroelectric film 3 through the lower electrode 2. If a reduction of the lower electrode 2 by the reducing atmosphere does not significantly affect the characteristics of the ferroelectric capacitor, the lower electrode 2 having the structure shown in FIG. 4G may be employed.

According to the above embodiment, at least one of the upper electrode 4 and the lower electrode 2 has an electrode stacked structure in which at least one of two or more oxide conductive layers and two or more metal layers are alternately stacked. From this, the oxide conductive layer or the metal layer in contact with the ferroelectric film 3 can be protected from the reducing atmosphere and kept robust, which may result in a ferroelectric memory device including a ferroelectric capacitor having an excellent property. More specifically, since the amount of hydrogen to which the ferroelectric film 3 of is exposed small, residual polarization and data maintenance properties can be improved. In addition, since an additional layer such as a conductive hydrogen barrier layer needs not to be provided, the entire manufacturing process can be simplified and micro-processing can be facilitated. For example, an addition of a conductive hydrogen barrier layer such as an IrTa amorphous layer requires a Ta target in addition to an Ir target, which leads to increase in the number of target species. Furthermore, since a high etching selectivity between the IrTa amorphous layer and the ferroelectric film 3 (for example, PZT) cannot be obtained, a micro-processing can be hardly performed. In contrast, since the configurations of the present embodiment requiring no conductive hydrogen barrier layer can decrease the number of target species, the entire manufacturing process can be simplified and the micro-processing can be facilitated.

When applying the present disclosure, even if the area of the upper electrode 4 is equal to or less than 1 $\mu m^2$, e.g., 0.85 $\mu m^2$, the contact area between the ferroelectric film 3 and the electrodes 2 and 4 can be sufficiently secured, and thus, it is possible to realize a ferroelectric memory device including a ferroelectric capacitor having characteristics (particularly, capacitance) as designed.

Further, if the above stacked electrode structure includes an oxide conductive layer in contact with the ferroelectric film 3 (see, FIGS. 3A, 3B, 3E, 3G, 4A, 4B, 4E and 4G), the reducing atmosphere can be effectively prevented from reaching the ferroelectric film 3 by the oxide conductive layer, and thus deterioration of the characteristics of the ferroelectric film can be reliably prevented.

Furthermore, if the above stacked electrode structure includes the metal layer in contact with the ferroelectric film 3 (see, FIGS. 3C, 3D, 3F, 4C, 4D and 4F), since the contact resistance between the metal layer and the ferroelectric film 3 can be lowered while preventing decrease in the contact area therebetween due to the reducing atmosphere, characteristics of the ferroelectric capacitor can be improved.

If the above stacked electrode structure includes a plurality of oxide conductive layers in some instances the oxygen compositions of the oxide conductive layers increase as it becomes closer to the ferroelectric film 3. For example, in the configurations shown in FIGS. 3A to 3E, the oxygen composition of the first iridium oxide layer 51 is higher than the oxygen composition of the second iridium oxide layer 52. Similarly, in the configurations shown in FIGS. 4A to 4E, the oxygen composition of the first iridium oxide layer 71 is higher than the oxygen composition of the second iridium oxide layer 72. Further, in the configurations shown in FIGS. 3B and 3D, the oxygen composition of the first iridium oxide layer 51 is higher than the oxygen composition of the second iridium oxide layer 52 and the oxygen composition of the second iridium oxide layer 52 is higher than the oxygen composition of the third iridium oxide layer 53. Similarly, in the configurations shown in FIGS. 4B and 4D, the oxygen composition of the first iridium oxide layer 71 is higher than the oxygen composition of the second iridium oxide layer 72 and the oxygen composition of the second iridium oxide layer 72 is higher than the oxygen composition of the third iridium oxide layer 73. With this configuration, since a layer closer to the ferroelectric film 3 has a higher oxygen composition, the reducing atmosphere is more likely to be consumed by the oxide conductive layer and is accordingly hard to reach the ferroelectric film 3. This can provide more reliable prevention of deterioration of the characteristics of the ferroelectric film 3.

In addition, in configurations shown in FIGS. 3A to 3G and FIGS. 4A to 4G, the oxide conductive layer is thicker than the metal layer in contact with the oxide conductive layer. With this configuration, since the oxide conductive layer is relatively thick and accordingly the reducing atmosphere is likely to be absorbed into the oxide conductive layer, the reducing atmosphere can be prevented from reaching the ferroelectric film 3.

Although the present disclosure has been illustrated with one embodiment, the present disclosure may be practiced with other embodiments. For example, while the upper electrode 4 employs one of the stacked electrode structures shown in FIGS. 3A to 3F, the lower electrode 2 may include a single layer, having a film thickness of about several ten nanometers to about 100 nm, formed by sputtering Pt, Ir or SrRuO$_3$, for example. In addition, the lower electrode 2 may be configured to have a stacked film including an Ir layer stacked to be in contact with the bottom surface of the ferroelectric film 3 and an Ir$_x$Ta$_{1-x}$ (0<x<1) layer stacked to be in contact with the bottom surface of the Ir layer. The thickness of each layer in the stacked film may be, e.g., about several ten nanometers to about 100 nm. Similarly, while the lower electrode 2 employs one of the stacked electrode structures shown in FIGS. 4A to 4F, the upper electrode 4 may include a single layer, having a film thickness of about 200 nm, formed by sputtering a transparent electrode film made of, e.g., Pt, Ir, iridium oxide (IrO$_2$), SrRuO$_3$, ITO or ZnO.

Although it has been illustrated in the above-described embodiments that an iridium oxide layer is used as an oxide conductive layer and an iridium layer is used as a metal layer, arbitrary combination of the oxide conductive layer and the metal layer may be employed. As described above, the oxide conductive layer and the metal layer can be formed in the same chamber by sputtering if the oxide conductive layer is made of oxide of the metal forming the metal layer. However, the oxide conductive layer may be made of oxide of metal other than the metal forming the metal layer, or may be made of other conductive oxides.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A ferroelectric capacitor comprising:
   a ferroelectric film including a first surface and a second surface;
   a lower electrode including a first surface and a second surface, the first surface of the lower electrode in contact with the first surface of the ferroelectric film;
   an upper electrode in contact with the second surface of the ferroelectric film, wherein at least one of the upper electrode or the lower electrode has a stacked electrode structure in which one or more oxide conductive layers and one or more metal layers are stacked alternatively;
   a conductive barrier film in contact with the second surface of the lower electrode; and
   a porous iridium region including voids formed in the one or more oxide conductive layers made of iridium oxide, and formed of iridium by losing oxygen from the one or more oxide conductive layers.

2. The ferroelectric capacitor of claim 1, wherein the stacked electrode structure includes at least two oxide conductive layers and at least one metal layer, and has a sandwich structure in which one metal layer is interposed between two adjacent oxide conductive layers.

3. The ferroelectric capacitor of claim 1, wherein the stacked electrode structure includes at least one oxide conductive layer and at least two metal layers and has a sandwich structure in which one oxide conductive layer is interposed between two adjacent metal layers.

4. The ferroelectric capacitor of claim 1, wherein one of the oxide conductive layers is in contact with the ferroelectric film.

5. The ferroelectric capacitor of claim 1, wherein one of the metal layers is in contact with the ferroelectric film.

6. The ferroelectric capacitor of claim 1, wherein the stacked electrode structure includes two or more oxide conductive layers, a first oxide conductive layer has a higher oxygen composition than a second oxide conductive layer, and the first oxide conductive layer is closer to the ferroelectric film than the second oxide conductive layer.

7. The ferroelectric capacitor of claim 1, wherein each of the oxide conductive layers is thicker than each of the metal layers in contact with said each of the oxide conductive layers.

8. The ferroelectric capacitor of claim 1, wherein the oxide conductive layers are made of oxide of metal forming the metal layers.

9. The ferroelectric capacitor of claim 1, wherein the oxide conductive layers are made of iridium oxide and the metal layers are made of iridium.

10. The ferroelectric capacitor of claim 1, wherein an area of the upper electrode is equal to or less than 1 μm$^2$.

11. The ferroelectric capacitor of claim 1, wherein an insulating hydrogen barrier film is continuously formed on the top surface of the upper electrode and side walls of the upper electrode, the ferroelectric film, the lower electrode, and the conductive barrier film.

12. The ferroelectric capacitor of claim 1, wherein the porous iridium region including void reaches to one of the at least one or more metal layers stacked on top of the at least one of the oxide conductive layers made of iridium oxide.

13. The ferroelectric capacitor of claim 1, wherein the porous iridium region including void reaches to one of the at least one or more metal layers stacked below the at least one of the oxide conductive layers made of iridium oxide.

\* \* \* \* \*